United States Patent [19]

Gremion et al.

[11] Patent Number: 5,501,786
[45] Date of Patent: Mar. 26, 1996

[54] METHOD OF MAKING THE COMPOUND CUINSE$_2$

[75] Inventors: François Gremion, Meinier, Switzerland; Jean-Paul Issartel, Cranves-Sales, France; Klaus Mueller, Grand-Lancy, Switzerland

[73] Assignee: Yazaki Corp., Tokyo, Japan

[21] Appl. No.: 382,008

[22] PCT Filed: Jun. 7, 1994

[86] PCT No.: PCT/IB94/00147

§ 371 Date: Feb. 3, 1995

§ 102(e) Date: Feb. 3, 1995

[87] PCT Pub. No.: WO94/29904

PCT Pub. Date: Dec. 22, 1994

[30] Foreign Application Priority Data

Jun. 8, 1993 [CH] Switzerland ............................. 722/93

[51] Int. Cl.$^6$ ........................................................ C25D 15/00
[52] U.S. Cl. ......................... 205/109; 205/176; 205/191; 205/228; 205/238
[58] Field of Search ................................. 205/109, 176, 205/191, 228, 238; 204/123

[56] References Cited

U.S. PATENT DOCUMENTS

| | | | |
|---|---|---|---|
| 4,581,108 | 4/1986 | Kapur | ........................ 205/170 |
| 5,275,714 | 1/1994 | Bonnet | ................................... 205/109 |

FOREIGN PATENT DOCUMENTS

| | | |
|---|---|---|
| 2668299 | 4/1992 | France . |
| 925586 | 4/1992 | WIPO . |

OTHER PUBLICATIONS

Guillen et al: "Cathodic electrodeposition of CuInSe2 thin films", Thin Solid Films, vol. 195, No. 1/2, Jan. 1991 p. 138—p. 139, p. 141— figure 3.

Singh et al: "Electrodeposited semiconducting CuInSe2 films: I. Preparation, structural and electrical characterisation", Journal of Physics D. Applied Physics, vol. 19, No. 7, Jul. 1986, pp. 1299–1309.

Kumar et al: "Preparation and properties of a Cu–In alloy precursor for CuInSe2 films", Solar Energy Materials vol. 26, No. 1/2, Mar. 1992, pp. 149–158.

Hodes et al: "Electrodeposition of CuInSe2 and CuInS2 films", Solar Cells, vol. 16, No. 1/4, Jan. 1986, pp. 245–254.

Herrero et al: "Electrodeposition of Cu–In alloys for preparing CuInS2 thin films", Solar Energy Materials vol. 20, No. 1/2, Jan. 1990, pp. 53–65.

Primary Examiner—John Niebling
Assistant Examiner—Brendan Mee
Attorney, Agent, or Firm—Cushman Darby & Cushman

[57] ABSTRACT

A method of making the compound CuInSe$_2$ (CIS) by depositing a precursor of the compound at least partly electrolytically on a substrate and forming CuInSe$_2$ by thermal reaction.

18 Claims, No Drawings

METHOD OF MAKING THE COMPOUND CUINSE$_2$

BACKGROUND OF THE INVENTION

1. Field of the Invention

The present invention relates to a method of making the compound CuInSe$_2$ (CIS) by depositing a precursor of this compound at least partly electrolytically on a substrate and forming the compound CuInSe$_2$ by thermal reaction.

2. Description of the Prior Art

DE-C2-4103291 discloses a method of making thin films of CuInSe$_2$ by galvanic deposition of a layer of Cu/In containing Se dispersed in the form of particles in a stoichiometric ratio, followed by a heat treatment to form the compound CuInSe$_2$, which acts as a photosensitive semiconductor layer which, once covered with a layer of CdS for example, constitutes a photovoltaic diode.

The electrolytic deposition, in particular of the In, has to meet an economic requirement. It is essential that the price/photovoltaic performance ratio be competitive with other means of production of electric energy. It is for this reason that the methods of deposition of all the compounds in the vapor phase which have already been proposed are much too expensive to produce solar cells at competitive prices. In fact, the deposition of In in the vapor phase brings about a condensation of In on the walls of the chamber. The quantity of In thus lost is substantial. Furthermore, In is an expensive metal.

Not only does electrolytic deposition give rise to difficulties in simultaneously depositing the three elements Cu In Se, but in addition, given the extreme reactivity of Se, it turns out that one of the rare substrates more or less able to resist Se at the moment of the formation of the compound CIS is Mo. Every specialist in electrochemistry knows that molybdenum constitutes a substrate on which it is difficult to deposit metals or alloys with an excellent adhesion by galvanic means. Thus copper can only be deposited with relative difficulty on molybdenum by this means and the alloy In-Cu has a very poor adhesion. Furthermore, molybdenum adheres very poorly on glass which generally forms the most common support for photovoltaic cells.

It will thus be realized that if the problem of jointly depositing Cu In Se has been solved, there remain other problems to solve in order to permit the production of photovoltaic cells with a CuInSe$_2$ film (hereinafter referred to as CIS) obtained at least partially by galvanic deposition.

SUMMARY OF THE INVENTION

The object of the present invention is precisely to offer a solution to the problem of deposition at least partially by galvanic means of a composite which acts as a precursor to CIS on a substrate of molybdenum.

To this end, this invention has as its object a method of making a CuInSe2 compound by depositing a precursor of this compound at least partly electrolytically on a substrate and forming the CuInSe$_2$ compound by thermal reaction according to claim 1.

One of the advantages of the solution proposed is the increase in the adhesion of the CuInSe$_2$ layer on the conductive substrate, thus decreasing at the same time the porosity of the interface. In fact, this reduction in the porosity is at least in part the reason for the improved adhesion of the CIS layer.

The more or less separate deposition of Cu and In, by commencing with one or other of these elements, by galvanic means or by PVD, or by PVD followed by galvanic deposition, with the incorporation of Se in the form of particles in at least one of the Cu or In layers, allows the obtention of a precursor well adapted to the transformation into CIS while maintaining a good adhesion to the substrate. It is known that a large increase in volume of the In/Cu layer occurs upon selenization in the formation of the compound CuInSe$_2$. It has been observed that the incorporation of a certain proportion of Se in the form of particles in at least one of the layers, which is mainly or wholly In or mainly or wholly Cu, allows a large reduction in this increase in volume and thereby in the risk of delamination of the CIS layer.

In addition to the problem of adhesion, the fact that the Cu and In elements are deposited separately has an advantage from the electrochemical point-of-view. The deposition of In is accompanied by a release of hydrogen, which is further favored by the presence of Se particles. As a result, this phenomenon makes the joint deposition of Cu and In very difficult, above all because the release of hydrogen is not constant, such that it becomes extremely difficult, if not impossible, to maintain a constant Cu/In ratio in these conditions.

There exist two means of obtaining a layer comprising > than 50% At of In, one by depositing In in an electrolyte indium, which gives a layer 100% In, the other by depositing a layer between 50 and 100% At of indium from a bath containing, either a mixture Cu/In in an atomic ratio between 1:3 and 1:50, or the same mixture to which has been added a certain quantity of dry particles of Se and in which one operates with a relatively high current density. On this basis, there can be obtained a double layer of the precursor of CIS by successive depositions of a first layer rich in indium ($\leq$100% At) and a second layer rich in Cu ($\leq$100% At).

To obtain the first layer between 50 and 100% At of Indium, the current density is increased above 3.5 A/dm$^2$. To obtain the second layer, the current density is reduced by making the overall atomic proportion Cu/In of the two layers either for example 50/50 for the formation of a 1:1 alloy of Cu and In, or 25/25 in the case where simultaneously 50% At of selenium is deposited in the form of particles dispersed in the Cu/In bath to obtain the first precursor layer of CIS.

The addition of Se to the Cu/In layer can be obtained in different ways. One can incorporate by simultaneous deposition, during the galvanic deposition of metals, either the stoichiometric or under-stoichiometric quantity of Se$_2$ to the Cu/In by dispersing particles of selenium in the bath(s) of Cu/In. One can also envisage adding either the total amount of Se, or a complement in the form of Se vapor released or produced in a reactor in the form of a separate layer deposited on the Cu/In layer by silk screening or by any other appropriate printing process such as stamping or by a combination of these two processes.

To improve the adhesion of the Mo layer on the glass plate, one can deposit an underlayer of chromium 0.2 µm thick for example, by PVD and then the molybdenum by the same technique. It should nevertheless be pointed out that this chromium layer is not essential and its function can be replaced by a scouring step by ionic bombardment of the glass substrate before the deposition of Mo by PVD. Nevertheless, the difference in coefficients of thermal expansion between glass and molybdenum and the mechanical constraints inherent in the structure of the PVD layers necessitate the optimization of the deposition parameters (temperature of the substrate, pressure of argon, partial pressure of oxygen, speed of deposition) and the relaxation process, as well as the thickness of the Mo layer. During the thermal treatment for the formation of the CIS compound, of which the temperature reaches 400–450° C., there is no risk of reaction between Cr and Mo at this temperature.

As has already been mentioned, the electrolytic deposition of Cu on Mo is difficult to carry out. Given that Mo is deposited by PVD on glass or an underlayer of Cr, as has already been indicated, it is possible during the course of the same deposition operation to form a layer of Cu on Mo. This layer of Cu can be extremely thin, preferably ≦0.2 µm. In a variant it is also possible to deposit by PVD the entire quantity of Cu necessary for the precursor layer of CIS. The covering of Cu on Mo allows the protection of the surface of Mo during storage of the substrate.

Instead of Mo forming the substrate for the CIS layer, it is possible to use TiN or ZrN, both also deposited by PVD or even CVD. Given the lower electrical conductivity of TiN and ZrN relative to Mo, it is preferable during the course of the same coating operation by PVD to deposit at least one thin layer <1 µm of Cu before moving to the galvanic deposition representing either the whole or a part of the copper necessary for the precursor of CIS. The Cu layer permits an improvement in the electrical conductivity of the substrate for the ultimate galvanic deposition.

DESCRIPTION OF THE PREFERRED EMBODIMENTS

All the examples which follow have been prepared on ordinary soda-calcium glass slides provided precleaned by the manufacturer (Menzel Glass, Germany) and forming the support for the Mo, TiN or ZrN substrate.

This glass has first been subjected to a chemical scouring operation in a 10% hydrofluoric acid solution at room temperature for approximately 3 minutes. This chemical scouring was followed by an ionic scouring in a low temperature argon plasma, or possibly argon plus oxygen.

After the ionic scouring, the glass support substrate was arranged opposite the cathode of a magnetron equipped with a 99.8% chrome target (from Cerac, Milwaukee, USA). The target-substrate distance was 50 mm. The atomization chamber, which was at a pressure of 0.4 Pa, was supplied with argon at a flow rate of 40 cm$^3$/min and the magnetron was supplied with a low intensity current (typically 2 A/dm$^2$). A 0.2 µm chromium adhesion layer was deposited at a speed of 4.8 nm/s.

Then, the substrate support was turned to face a second magnetron cathode, provided with a 99.9 % molybdenum target (from Plansee, Reutta, Austria), the target-substrate distance being 55 mm. The atomization chamber was at a pressure of 0.3 Pa and supplied with argon at a flow rate of 30 cm$^3$/min. A 2 µm molybdenum layer was deposited on the chrome adhesion layer at a speed of 6.5 nm/s.

As mentioned previously, the Cu layer can be deposited on the Mo or TiN by PVD. To this end, the glass layer Cr/Mo substrate was placed opposite the cathode of a magnetron equipped with a 99.99% Cu target (from Cerac, Milwaukee, USA). The target substrate distance was 70 mm. The atomization chamber was at a pressure of 0.3 PA and was supplied with argon at a flow rate of 30 cm$^3$/min. The deposition speed was 3 nm/s and the thickness of deposition was from 0.1 to 0.2 µm. In this example, an adhesion layer was deposited only for the ultimate galvanic deposition. If it is desired to deposit a thicker layer corresponding for example to the whole of the copper to be deposited for the CIS layer, the deposition speed can be increased to 15 nm/s.

In can also be deposited by PVD, although as indicated, the metal being expensive, a substantial proportion is lost during this process.

To this effect, the glass/Cr/Mo substrate is placed above a molybdenum bath (from Balzers AG, Liechtenstein) containing pieces of 999.99% Indium (also from Balzers). The deposition pressure was <10$^{-3}$ Pa. The bath was heated by the Joule effect to the evaporation temperature of In. The speed of deposition was 10 nm/s.

As indicated, the TiN can be deposited on a glass substrate. After Ionic scouring of this substrate, the glass substrate is arranged opposite the cathode of a magnetron equipped with a target of 99.9% Ti (from Cerac, Milwaukee, USA). The target-substrate distance is 50 mm. The atomization chamber is at a pressure of 0.4 Pa with a gas flow rate containing a mixture of very pure argon and nitrogen (N48). This reactive atomization allows the deposition of a titanium nitride layer at a speed of 1 to 2 nm/s. On this layer of approximately 1.2 µm there is deposited immediately afterward during the same deposition process and in the same operation conditions indicated previously a layer of Cu of which adhesion on the TiN is excellent, which allows the galvanic deposition of the precursor of the CIS compound.

The powdered selenium which is mixed in the galvanic bath is either a powder from Noranda, Canada, sold under the name 5N and its granulometry measured in the samples ranged from 1.96 to 2.72 µm with a dispersion going from 0.84 µm to 1.07 µm, respectively, or a powder from Retorte (Germany) with characteristics near to those of the Noranda product. This powder is hydrophobic such that is disperses poorly in In-Cu electrolytic deposition baths. To solve this problem, a solid dispersion was prepared in liquid in a 250 ml polyethylene bottle in which 200 g of $Si_3N_4$ balls of 5 mm in diameter had been placed, as well as 18 g of powdered selenium (Noranda), 100 ml of galvanic deposition In-Cu fluid having a pH of 1.4, and 1 ml of liquid Fluorad FC171 (3M) surfactant. This mixture was comminuted from 24 to 48 h, after which the selenium powder became wettable and the initial mixture took on a pasty consistency. This comminution had little effect on the granulometry which, after the comminution operation, ranged from 1.64 µm to 1.83 µm with a dispersion of 0.83 µm.

In accordance with another process of incorporation the selenium powder and the electrolytic bath, which permits at the same time a substantial reduction in the size of the particles, the same 250 ml polyethylene flask containing 200 g of $Si_3N_4$ balls, 10 g of Se powder (from Retorte, Germany) and 20 g of double sodium and potassium tartrate (Seignette's salt, Siegfried No 16.33.00.04) was rotated for 20 hours. 180 ml of water and 0.14 g of Triton X-100® dispersant were added and the flask again rotated for 12 hours. Other salts, such as sodium sulfate or potassium citrate have given similar results in this comminution procedure, partially under dry conditions.

One thus obtains a finely comminuted powder of which the mean size of the grains is 0.74 µm with a dispersion of 0.54 µm. This reduction in the size of the particles of selenium is very important to the extent that it allows the reduction in thickness of the layer containing these particles.

In accordance with another variant, the comminution is carried out by rotating for 1 hour and 30 minutes a 1 l polyethylene flask containing 1017 g of $Si_3N_4$ balls, 50 g of selenium powder and 100 g of citric monohydride. One then adds 303 g of demineralized water and 0.50 g of Triton X-

100® dispersant. The flask was rotated for 46 hours. The mean size of the powder particles ranged from 0.88 μm with a dispersion of 0.74 μm. In accordance with another variant, the comminution was carried out in a double-cone CoBall Mill grinder (from the firm Rheinfelden, Switzerland) with ceramic balls having a diameter <1 mm in the liquid phase containing a dispersant and at rotor speeds in the order of 15 m/s. This comminution gives particles having a size substantially less than 1 μm.

It should nevertheless be mentioned that the present invention is not limited to the stoichiometric deposition of Cu, In, $Se_2$, in one or two baths. In fact, as will appear from what follows, preferably, the Se can be added, at least in part, in other forms. Above all, the object of the invention is the electrolytic deposition of Cu-In on an electrically conductive substrate capable of offering a resistance to Se in the vapor phase. This deposition can take place in several ways, as will be illustrated in the examples which follow.

In these examples, a 210×55×60 mm electrolytic cell filled with 500 ml of electrolyte was used.

The Se powder dispersed in the bath can bring about, following its concentration, a foam phase covering a liquid phase, or a liquid phase alone uniformly dispersed.

EXAMPLE 1

A molybdenum substrate on the 15×15 mm glass slide prepared as above was taken. This was scoured with alkali. An alkaline bath of pH 9–11 was then prepared with 0.2 mol/l indium sulfate, and the substrate was immersed in the latter and subjected to a cathodic potential and then placed 20 cm from an inert Pt anode. The current density was 2 $A/dm^2$ and the thickness of the deposit was 0.2 μm.

The In covering was carefully rinsed in demineralized water and then placed in a second acid bath of pH 1.3 containing copper sulfate and indium sulfate in an atomic ratio Cu/In of 1:20. The current density was adjusted to <1.1 $A/dm^2$ so that the overall atomic proportions of the first layer of indium and the second layer of CuIn alloy of 3 μm thickness was substantially 50/50. In effect, the more the current density decreases, the more the proportion of Cu in the deposit increases and vice verse.

The selenium can be added separately, either by silk screening or by stamping, or directly in the reactor during the thermal reaction forming the $CuInSe_2$ compound, as will be described below, or by a combination of these three methods.

EXAMPLE 2

A pH 1.3 acid bath of copper sulfamate and indium sulfamate in an atomic ratio of 1:20, 0.01 mole/l Cu, 0.2 mole/l In, was provided, in which the sample with the molybdenum substrate, obtained as described previously, was immersed as the cathode at a distance of 20 cm from the inert Pt anode. In a first period, the current density was brought to 4 $A/dm^2$ to form a first layer of at least 0.2 μm containing >95% In. Then, the current density was lowered to less than 1.1 $A/dm^2$ so that the overall thickness of the two layers in the order of 2 μm had an atomic ratio Cu/In substantially equal to 50/50. The overall concentrations of Cu and In in the two layers were determined by dissolving in nitric acid concentrated and analyzed by AES-ICP (atomic emission and induced plasma spectroscopy).

EXAMPLE 3

The same bath was employed as in Example 2, but with an atomic ratio Cu/In 1:25 to which was added 200 g/l of Se powder and 0.3 g/l of liquid surfactant Fluorad FC 171 (3M), and with an inert Pt anode.

The sample carrying the Mo substrate was immersed in the foam phase of the bath at a distance of 20 cm from the anode and the liquid in the bath was circulated at 4 l/min so as to spill onto an inclined plane above the bath and form a curtain of liquid which irrigated the surface of the substrate. The current density was 4 $A/dm^2$. After 30 s, a first layer was formed whose atomic composition was about 60% In, 30% Cu and 10% Se.

The irrigation of the substrate surface was stopped without stopping the circulation of the liquid in the bath, and the cathode (substrate) was moved in an alternating movement in its horizontal plane, thus parallel to the anode, with an amplitude of 3 cm and a period of 2 s. The duration of the deposition was 3 min and the thickness of the second layer in the order of 10 μm. The atomic composition of this layer was in the order of 25% for the Cu, 15% for In and 60% for Se.

In this example, the difference between the atomic compositions of the first and second layer depend only on the motion between the bath and the substrate, the electrical parameters remaining constant. It was observed that the first layer containing >50% At of In ensured a sufficient adhesion on the Mo substrate.

EXAMPLE 4

The same bath was used as for Example 3, with an anode of inert Pt.

In this example, the sample (cathode) was arranged 20 cm from the anode and did not move during the deposition process.

The deposition was thus commenced with a current density of 6 $A/dm^2$ for 1 min, after which it was lured to 1.56 $A/dm^2$ for 5 min. Electronic microscope observation showed a layer in the order of 8 μm thickness for the first less porous layer, richer in In, which facilitated the adhesion on the Mo relative to the deposition without the first layer on the surface of the substrate.

It appeared furthermore that the dispersion of Se in the Cu-In bath brought about a change in the ratio of deposited Cu-In. Starting with a given bath, the more the Se is dispersed, the less In there is in the deposited layer, whence the solution adopted in Example 3, which constitutes an alternative way of obtaining a first layer rich in In.

EXAMPLE 5

A pH 1.3 acid bath of copper sulfamate and indium sulfamate in an atomic ratio of 1:20, 0.01 mole/l Cu, 0.2 mole/l In, was provided, in which the sample with the molybdenum substrate, obtained as described previously, was immersed as the cathode at a distance of 20 cm from the inert Pt anode. In a first period, the current density was brought to 4 $A/dm^2$ to form a first layer of at least 0.2 μm containing >95% In. Then, the current density was lowered to <1.1 $A/dm^2$ so that the overall thickness of the two layers was in the order of 2 μm having an atomic ratio Cu/In substantially equal to 50/50.

Then, a silk screening paste was prepared by mixing the selenium powder (having a mean particle size in the order of 1 micron) with a binder and a solvent:

| | |
|---|---|
| 80 g | terpineol (solvent) |

| | |
|---|---|
| 7.8 g | ethylcellulose (binder) |
| 26 g | selenium powder |

This paste was then silk screened onto the surface of the Cu/In layer previously prepared by using a silk screen equipped with a polyester screen (ZBF, Monolen 130 T). The distance between the lower face of the screen and the layer of Cu/In was adjusted to 2 mm and the speed of the blade on the screen was adjusted to 5 cm/sec. The selenium layer thus silk screened was then dried for 2 hours at 40° C. Under these conditions, the silk screening operation produced a regular layer of thickness in the order of 3–6 μm after drying. The organic products used in the preparation of the silk screening paste (binders) were thus removed without leaving residue during a heat treatment at a moderate temperature (400° C. for 1 hour).

To obtain the layer of the $CuInSe_2$ compound, a heat treatment was carried out as will be described as follows.

EXAMPLE 6

The preparation of the selenium powder in this example commences by a dry comminution operation which consists of introducing in a 1 liter PE flask, 40 g of dry Se (from Retorte, Germany), 80 g of the double sodium potassium salt of tartaric acid (Seignette's salt) Siegfried, No. 16.33.00.04, or certain other salts of sodium or potassium and 800 g of $Si_3N_4$ balls. The flask was rotated at 100 RPM for 15 hours and then 282 g of water and 0.4 g of Triton X-100® were added. The comminution was carried out in the liquid phase at the same speed for 6 h 30 min.

The amount of water was topped up to 1 liter and a first sedimentation carried out. The floating product was still a slight problem. A transfer was carried out to a 2 liter flask that was topped up with water and allowed to settle for 40 hours 45 min. 1500 g of water were removed. 0.4 liters of Se solution remained. 0.6 liters of solution of 0.10 moles of In +0.5 moles of $Na_2SO_4$ were added, and then a dispersant, here 0.4 g of Triton X-100® was added. Comminution was then carried out for 27 hours, the balls separated with a sieve, and topped up with water to 3 liters and then stirred with a magnetic stirrer to maintain the Se in suspension.

In this example, In with particles of Se was deposited electrolytically on a layer of Cu alone by PVD, as described previously, or by PVD followed by a galvanic coating of pure Cu.

To this end, there was provided a 2 pH acid bath of In sulfate, with 0.10 moles of In, in which was incorporated 13 g/l of Se.

The bath thus prepared was placed in a two compartment vat, and circulated by a pump and spilled from one compartment to the other by overflowing. It was regulated in temperature and stirred with the aid of magnetic bars. The deposition was carried out in a second compartment while the contents of the first compartment were subjected to ultrasound. The glass substrate+Mo or glass+Mo+Cu (deposited by PVD), as cathode, was immersed at a distance of 14 cm from the inert Pt anode. A current density of 3 A/dm² was applied and a layer of In containing 5 to 20% At of Se obtained.

EXAMPLE 7

This was an example identical to Example 6, but in which the substrate of glass+Mo+Cu was replaced with a substrate of glass+TiN+Cu deposited by PVD. The layer of the CIS precursor deposited by galvanic means comprised 30 to 50% At of Se in powder form.

EXAMPLE 8

In this example, a glass substrate+Mo+Cu+In deposited by PVD (or possibly Cu by PVD and In by galvanic means) was covered with a galvanic deposition of Cu with Se powder. The quantities of Cu and In deposited by PVD were clearly under-stoichiometric.

A pH 1 acid bath of copper sulfate prepared in a 2 liter PE flask was provided, in which was placed 120 g $CuSO_4$ +77 g of citric acid +74 g $H_2SO_4$ (=271 g), 0.13 g of Triton X-100®, 13 g dry Se (from Retorte, Germany) and 260 g of $Si_3N_4$ balls.

This was rotated at 100 RPM for 87.5 hours. The balls were separated with a sieve, and a small quantity removed and then rinsing was carried out with water to top up to 1 liter.

The bath was placed in the same vat as for Example 6. The glass/Cu/In substrate was immersed as cathode at a distance of 14 cm from the inert Pt anode and the coating carried out. EDX analysis showed a particle incorporation of Se in an At proportion of 4%.

EXAMPLE 9

A pH 1.3 acid bath comprising Cu/In in the form of sulfamate in an atomic ratio of 1:20 with 200 g/l of powdered Se, included by comminution with $Si_3N_4$ balls in electrolyte as indicated previously, was provided. There was obtained a bath of two phases, liquid and foamy, respectively lean and rich in Se particles.

The coating of the glass/Cr/Mo substrate constituting the cathode was obtained by slightly stirring the cathode in the foamy phase rich in Se. This stirring consisted of displacing alternatively the cathode parallel to the inert Pt anode and, at the level of the electrolyte bath, with an amplitude of a few cms. The current density was 9.3 m A/cm² and the duration of deposition was 25 min.

In this deposition which formed one of the two layers of the CIS precursor, X-ray energy dispersion spectroscopic analysis X (EDX) gave 2.28% Cu, 97.32% Se.

EXAMPLE 10

A 1.3 pH acid bath comprising Cu/In in the form of sulfamate in an atomic ratio 1:6 with 200 g/l of Se, incorporated in the electrolyte by comminution with the aid of $Si_3N_4$ balls, was provided. Two phases were obtained, one liquid, lean in Se, and the other foamy, rich in Se. The glass/Cr/Mo substrate constituting the cathode was subjected to an alternating movement a few cms in amplitude, parallel to the anode and vertically. A current density of 2.89 A/dm² was applied for 3 min.

In this example which represents one of the two layers of the CIS precursor, the X-ray energy dispersion spectrometric analysis (EDX) gave 55.5% Cu, 15.7% In, 28.8% Se.

Colloidal particles of Se can also be produced; selenic acid is reduced with hydrazine (catalyzed with acid).

Selenium was produced in a medium of water or acid with less success than in an alkaline medium. The formation of colloid is visible by a distinct change in color of the solution toward red and can be tested by the Tyndall effect. Following the concentration of selenic acid and hydrazine, the reaction can be relatively slow and is consequently easily controllable (for example in a solution of 1 mM of $Se^{iv}$, the colloidal Se becoming visible after 30 minutes). A temperature of 30°–45° C. causes a certain acceleration of the reaction period. A stabilizer such as gelatine seems necessary to avoid precipitation of the colloidal solution by coagulation and aggregation of the particles. Such a colloidal solution is added to the galvanic bath of Cu or In to produce composite deposits of metals with particles of Se incorporated. The advantage of this solution is the ability to introduce particles of even finer Se and to thus reduce the thickness of the CIS layer.

The thermal selenization treatment for forming the CIS compound by reaction between the elements of the deposited precursor is carried out by placing the samples vertically in a graphite crucible heated by induction. This treatment is carried out in a vacuum of the order of $10^{-2}$ Pa. The atmosphere in the vicinity of the samples is enriched in Se vapor caused by the evaporation of granules of Se of 0.3–3 mm placed below the samples. The partial pressure of selenium is adjusted by the temperature used for the selenization.

The selenization cycle is carried out by introducing in the base of the crucible 0.2 g of selenium particles, then by heating the uncovered crucible at 15° C./min to 104° and maintaining this temperature for 5 min to ensure a complete drying of the samples. The cover of the graphite crucible is then lowered, and the crucible heated at 15° C./min to 400° C., which is the selenization temperature. This temperature was then maintained for 1 hour. The heating was then stopped and the samples allowed to cool to ambient temperature over 1.5 hours.

In accordance with another embodiment, the selenization cycle is carried out by introducing 0.1 g of Se granules into the crucible as well as the samples. The crucible is heated at 15° C./min to 108° C. and maintained at this temperature for 5 min to dry the samples. The graphite cover was then lowered onto the crucible, which was heated at 15° C./min to 450° C. This temperature was maintained for 1 hour, then the cooling took place as described previously.

We claim:

1. A method of making a $CuInSe_2$ compound comprising the steps of:
   a) providing an electrically conductive substrate the total surface of which is substantially chemically resistant to Se in the vapor phase;
   b) depositing on said substrate a first layer comprising between 50 atomic % and 100 atomic % of In or Cu, the remainder of said layer being at least in part Cu or In respectively;
   c) depositing on said substrate a second layer having a composition between 50 atomic % and 100 atomic % of Cu or In so that the overall atomic ratio In/Cu of the two layers together is between 45/55 and 55/45;
   d) incorporating, when depositing at least one of said layers, Se in the form of particles such that Se is present in an amount between 3 and 100 atomic % of the combined atomic % of In and Cu in the two layers; and
   e) forming the $CuInSe_2$ compound by thermal reaction, where the atomic % of Se is lower than the combined atomic % of In and Cu of both layers, raising the proportion of Se to be equal to the combined atomic % of In and Cu of both layers by at least one of (i) depositing Se onto said second layer or (ii) carrying out said thermal reaction in a neutral atmosphere at the vapor pressure of Se.

2. A method as claimed in claim 1, wherein the Se is incorporated in the second layer in the form of particles mixed into an electrolytic In/Cu bath.

3. A method according to claim 2, wherein between 10 and 30 g/l of particles of Se are incorporated in the electrolytic bath.

4. A method according to claim 2, wherein the Se powder is prepared by a first dry comminution operation with ceramic balls and a salt of Na or K or a double tartrate followed by a second comminution operation with the addition of liquid in the form of water or electrolyte and a dispersing agent, and the thus comminuted powder is washed to eliminate the salt and obtain particles less than 1 µm.

5. A method according to claim 2, wherein the Se powder is placed in suspension in water containing a dispersing agent and the latter is placed in a double-cone grinder having ceramic balls of diameter less than 1 mm, and the latter is rotated at a speed in the order of 15 m/s.

6. A method according to claim 2, wherein the Se is incorporated in the galvanic bath in the form of colloidal particles.

7. A method as claimed in claim 1, wherein in step (e) the Se is deposited by printing onto said at least one In/Cu layer.

8. A method as claimed in claim 1, wherein said first layer and said second layer are formed with the aid of a common Cu/In galvanic bath, wherein the Cu/In atomic proportions are between 1:3 and 1:5, and wherein the current density is first increased to greater than 3.5 $A/dm^2$ for 30 seconds to form a layer comprising greater than 90 atomic % of In, and then the current density is lowered to less than 1.1 $A/dm^2$ for approximately 3 min to obtain overall atomic proportions of Cu/In between 45 and 55%.

9. A method as claimed in claim 1, wherein said first and second layers are formed with the aid of a common Cu/In galvanic bath for which the atomic proportion CU:IN is between 1:3 and 1:50, and in which there are dispersed approximately 200 g/l of selenium powder having a granulometry of less than 3 µm, the deposition of said first layer is carried out while the substrate is maintained fixed in contact with the electrolyte and then while it is subject to an alternating movement in a plane parallel to that of an anode of said bath.

10. A method as claimed in claim 1, wherein said first and second layers are formed with the aid of a common Cu/In galvanic bath for which the atomic proportion CU:IN is between 1:3 and 1:50, in which there are dispersed approximately 200 g/l of selenium powder having a granulometry of less than 3 µm, and the deposition of said first layer is carried out by bringing the current density greater than 5 $A/dm^2$ for approximately 60 seconds, and then lowering it to less than 2 $A/dm^2$ for 1 to 15 minutes.

11. A method as claimed in claim 1, wherein In and Cu are deposited independently in two separate galvanic baths, and the selenium is incorporated in at least one said galvanic bath in the form of particles.

12. A method according to claim 11, wherein between 10 and 30 g/l of particles of Se are incorporated in the electrolytic bath.

13. A method according to claim 11, wherein the Se powder is prepared by a first dry comminution operation with ceramic balls and a salt of Na or K or a double tartrate (Seignette's salt) followed by a second comminution operation with the addition of liquid in the form of water or electrolyte and a dispersing agent, and the thus comminuted powder is washed to eliminate the salt and obtain particles less than 1 µm.

14. A method according to claim 11, wherein the Se powder is placed in suspension in water containing a dispersing agent and the latter is placed in a double-cone grinder having ceramic balls of diameter less than 1 mm, and the latter is rotated at a speed in the order of 15 m/s.

15. A method according to claim 11, wherein the Se is incorporated in the galvanic bath in the form of colloidal particles.

16. A method as claimed in claim 1, wherein said electrically conductive substrate is selected from the group consisting of: Mo, TiN, and ZrN; and is deposited by physical vapor deposition.

17. A method as claimed in claim 16, wherein there is deposited by physical vapor deposition on the electrically conductive substrate a layer of Cu which is less than the stoichiometric proportion of the precursor of the $CuInSe_2$ compound, the remainder of the Cu being deposited by galvanic means.

18. A method as claimed in claim 1, wherein there is deposited by physical vapor deposition on the electrically conductive substrate a layer of Cu which is less than the stoichiometric proportion of the of the $CuInSe_2$ compound, the remainder of the Cu being deposited by galvanic means.

* * * * *